(12) United States Patent
Kikuchi et al.

(10) Patent No.: US 11,674,224 B2
(45) Date of Patent: Jun. 13, 2023

(54) FILM FORMING METHOD AND FILM FORMING APPARATUS

(71) Applicant: Tokyo electron limited, Tokyo (JP)

(72) Inventors: Yasuaki Kikuchi, Iwate (JP); Tatsuya Yamaguchi, Iwate (JP); Kazuteru Obara, Iwate (JP); Ryuji Kusajima, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 18 days.

(21) Appl. No.: 16/852,478

(22) Filed: Apr. 19, 2020

(65) Prior Publication Data

US 2020/0340111 A1    Oct. 29, 2020

(30) Foreign Application Priority Data

Apr. 26, 2019  (JP) .............................. JP2019-086435

(51) Int. Cl.
*C23C 16/455*      (2006.01)
*C23C 16/458*      (2006.01)
*C23C 16/34*       (2006.01)

(52) U.S. Cl.
CPC ...... *C23C 16/45527* (2013.01); *C23C 16/345* (2013.01); *C23C 16/4583* (2013.01)

(58) Field of Classification Search
CPC .................................................. C23C 16/52
See application file for complete search history.

(56) References Cited

U.S. PATENT DOCUMENTS

| | | | | |
|---|---|---|---|---|
| 2003/0072875 | A1* | 4/2003 | Sandhu .................. | C23C 16/52 |
| | | | | 427/248.1 |
| 2003/0212507 | A1* | 11/2003 | Wei ........................ | C23C 16/52 |
| | | | | 702/45 |
| 2008/0264337 | A1* | 10/2008 | Sano .................... | C23C 16/4408 |
| | | | | 118/704 |
| 2009/0325389 | A1* | 12/2009 | Takebayashi ..... | C23C 16/45557 |
| | | | | 118/712 |
| 2017/0283985 | A1* | 10/2017 | Takahashi ............ | C23C 16/455 |

FOREIGN PATENT DOCUMENTS

| | | |
|---|---|---|
| JP | 2006-516304 A | 6/2006 |
| JP | 2006-186049 A | 7/2006 |
| WO | 20005/024926 A | 3/2005 |

* cited by examiner

*Primary Examiner* — Joseph A Miller, Jr.
(74) *Attorney, Agent, or Firm* — Venjuris, P.C.

(57) ABSTRACT

A film forming method includes: accommodating a substrate in a processing container of a film forming apparatus; supplying an inert gas to the processing container at a flow rate equal to an average flow rate of a plurality of gases to be supplied into the processing container in a film forming process and maintaining a pressure of the processing container to be substantially same as an average pressure of the processing container in the film forming process; and alternately supplying the plurality of gases into the processing container and forming a film on the substrate.

14 Claims, 4 Drawing Sheets

FILM FORMING METHOD AND FILM FORMING APPARATUS

CROSS-REFERENCE TO RELATED APPLICATIONS

This application is based on and claims priority from Japanese Patent Application No. 2019-086435 filed on Apr. 26, 2019 with the Japan Patent Office, the disclosure of which is incorporated herein in its entirety by reference.

TECHNICAL FIELD

The present disclosure relates to a film forming method and a film forming apparatus.

BACKGROUND

A batch-type substrate processing apparatus capable of performing, for example, a film forming processing on a plurality of substrates in a state where the plurality of substrates are held in multiple tiers in a substrate holder within a processing chamber, is known. As for the substrate processing apparatus, a technology that detects the inner temperature of a processing chamber by laying a protection tube at a position having a phase difference of 90 degrees from a cooling gas supply pipe laid vertically on one side of the processing chamber, and sealing a thermal contact of a thermocouple at the protection tube, is known (see, e.g., Japanese Patent Laid-Open Publication No. 2006-186049).

SUMMARY

A film forming method according to an aspect of the present disclosure includes: a film forming processing in which a film is deposited by alternately supplying a plurality of gases to a substrate accommodated in a processing container; and a film forming preparing processing performed before the film forming processing in which an inert gas is supplied at a flow rate equal to an average flow rate of the plurality of gases supplied into the processing container in the film forming processing, and a pressure inside the processing container is maintained to be substantially same as an average pressure of the processing container in the film forming processing.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
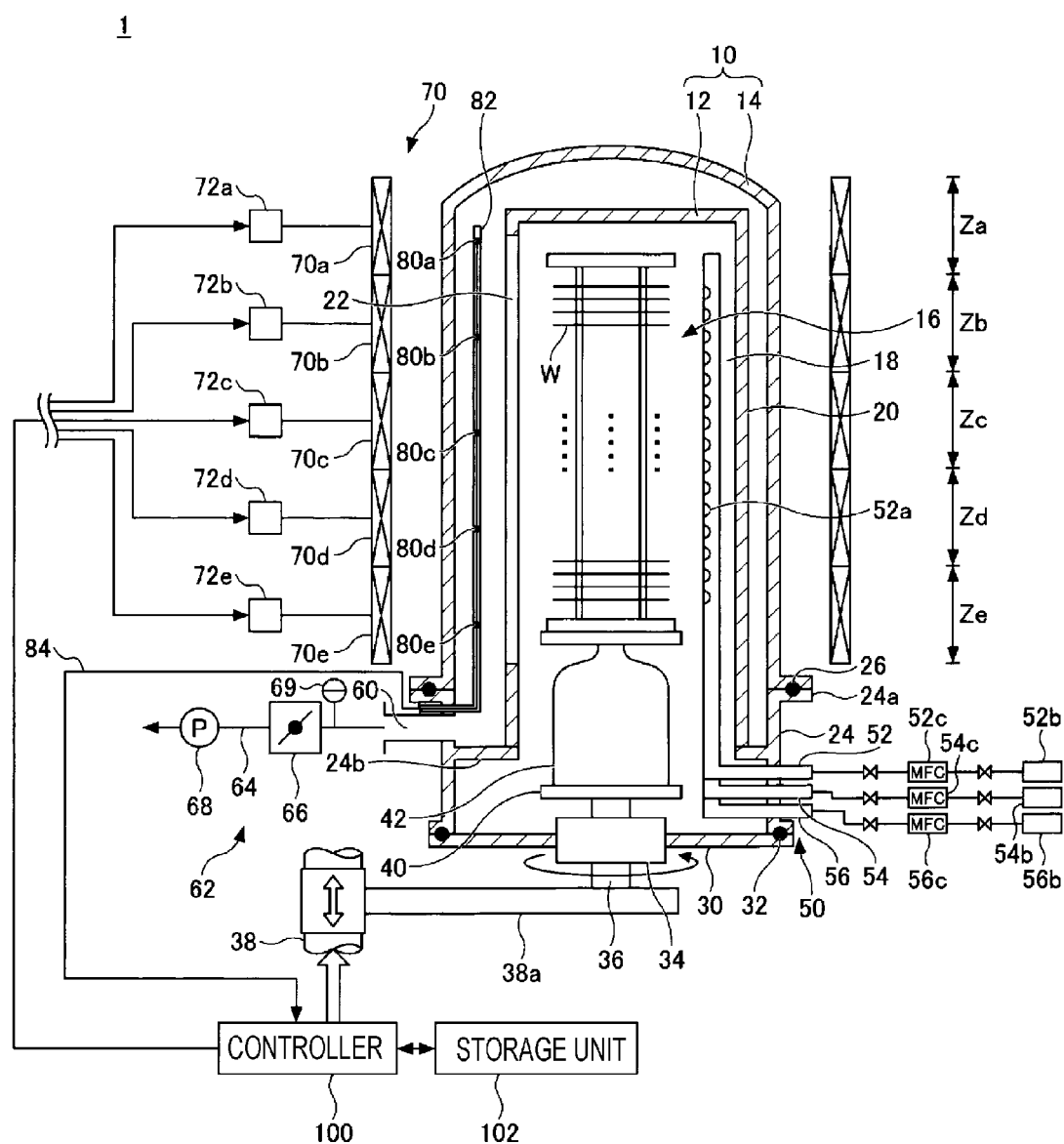
FIG. 1 is a cross-sectional view illustrating an exemplary configuration of a film forming apparatus.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the accompanying drawings, the same or corresponding members or parts are denoted by the same or corresponding reference numerals, and redundant explanations are omitted.

(Film Forming Apparatus)

Figure 2:
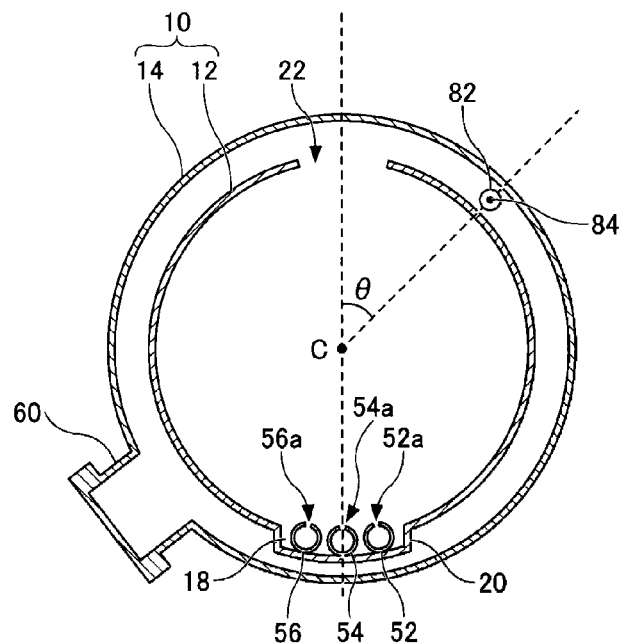
FIG. 2 is a view for explaining a processing container.

Descriptions will be made on a film forming apparatus according to an embodiment. FIG. 1 is a cross-sectional view illustrating an exemplary configuration of the film forming apparatus according to the embodiment. FIG. 2 is a view for explaining a processing container.

As illustrated in FIG. 1, a film forming apparatus 1 includes a vertically long processing container 10. The processing container 10 includes a cylindrical inner tube 12 having a ceiling and an open lower end, and a cylindrical outer tube 14 having a ceiling and an open lower end and configured to cover the outside of the inner tube 12. The inner tube 12 and the outer tube 14 are made of an insulating material such as quartz, and coaxially arranged to form a double tube structure. A wafer boat 16 is accommodated in the inner tube 12. The wafer boat 16 is a substrate holder that substantially horizontally holds a plurality of semiconductor wafers (hereinafter, referred to as "wafers W") at predetermined intervals along the vertical direction. The wafer W is an example of the substrate.

The ceiling of the inner tube 12 is, for example, flat. A nozzle accommodation portion 18 is formed at one side of the inner tube 12 and accommodates a gas supply pipe along the longitudinal direction (vertical direction) of the inner tube 12. For example, as illustrated in FIG. 2, the nozzle accommodation portion 18 is a portion of the inside of a block portion 20 formed by protruding a portion of a side wall of the inner tube 12 toward the outside. A rectangular opening 22 is formed on a side wall of an opposite side of the inner tube 12 facing the nozzle accommodation portion 18 along the longitudinal direction (vertical direction) of the inner tube 12.

The opening 22 is a gas exhaust port formed so as to exhaust the gas in the inner tube 12. The opening 22 has the same length as a length of the wafer boat 16, or extends in both the upper and lower directions to be longer than the length of the wafer boat 16.

A lower end of the processing container 10 is supported by a cylindrical manifold 24 made of, for example, stainless steel. A flange portion 24a is formed on an upper end of the manifold 24, and a lower end of the outer tube 14 is installed to be supported on the flange portion 24a. A seal member 26 (e.g., an O-ring) is interposed between the flange portion 24a and the lower end of the outer tube 14 so that the inside of the outer tube 14 is air-tightly sealed.

An annular support 24b is provided at an inner wall of the upper portion of the manifold 24, and a lower end of the inner tube 12 is installed to be supported on the support 24b. A cover 30 is air-tightly attached to an opening at the lower end of the manifold 24 through a seal member 32 (e.g., an O-ring) so as to air-tightly close the opening at the lower end of the processing container 10, that is, the opening of the manifold 24. The cover 30 is made of, for example, stainless steel.

A rotation shaft 36 is provided at the center portion of the cover 30 to penetrate through a magnetic fluid sealing portion 34. A lower portion of the rotation shaft 36 is rotatably supported by an arm 38a of a lifting unit 38 including a boat elevator.

A rotation plate 40 is provided at the upper end of the rotation shaft 36, and the wafer boat 16 that holds the wafers W is placed on the rotation plate 40 via a heat retention pedestal 42 made of quartz. Therefore, the cover 30 and the wafer boat 16 are integrally moved up and down by moving the lifting unit 38 up and down, so that the wafer boat 16 can be inserted into or removed from the processing container 10.

A gas supply 50 is provided at the manifold 24 and introduces a gas into the inner tube 12. The gas supply 50 includes a plurality (three in the illustrated example) of gas supply pipes 52, 54, and 56 made of quartz. Each of the gas supply pipes 52, 54, and 56 extends in the inner tube 12 along the longitudinal direction thereof, and its base end is bent in an L-shape and supported so as to penetrate the manifold 24.

As illustrated in FIG. 2, the gas supply pipes 52, 54, and 56 are installed to be aligned in a line along the circumferential direction in the nozzle accommodation portion 18 of the inner tube 12. Each of the gas supply pipes 52, 54, and 56 has a plurality of gas holes 52a, 54a, and 56a at predetermined intervals along the longitudinal direction. Each of the gas holes 52a, 54a, and 56a ejects each gas in the horizontal direction. The predetermined intervals are set to be, for example, the same as the intervals of the wafers W supported by the wafer boat 16. Further, a position in a height direction is set such that each of the gas holes 52a, 54a, and 56a is positioned in the middle of the wafers W adjacent in the vertical direction, and each gas can be efficiently supplied to the space between the wafers W. The gas supply pipes 52, 54, and 56 are connected to gas supply sources 52b, 54b, and 56b through flow rate controllers 52c, 54c, and 56c, and valves, respectively. The gas supply sources 52b, 54b, and 56b are supply sources of a film forming gas, an etching gas, and a purge gas, respectively. The flow rate of each gas from the gas supply sources 52b, 54b, and 56b is controlled by the flow rate controllers 52c, 54c, and 56c, and each gas is supplied into the processing container 10 through each of the gas supply pipes 52, 54, and 56 as necessary.

A gas outlet 60 is formed above the support 24b that is a side wall of the upper portion of the manifold 24, and is configured to be able to exhaust the gas in the inner tube 12 discharged from the opening 22 through the space between the inner tube 12 and the outer tube 14. The gas outlet 60 is provided at a position different from the opening 22 in the circumferential direction of the inner tube 12. In the illustrated example, the gas outlet 60 is provided at a position shifted by 120 degrees counterclockwise from the position of the opening 22 in the circumferential direction of the inner tube 12. The gas outlet 60 is provided with an exhaust unit 62. The exhaust unit 62 includes an exhaust passage 64 connected to the gas outlet 60, and a pressure adjusting valve 66 and a vacuum pump 68 are sequentially interposed in the exhaust passage 64 so as to evacuate the inside of the processing container 10. Further, a pressure sensor 69 configured to detect the pressure in the processing container 10 is provided on the upstream side of the exhaust passage 64 and the pressure adjusting valve 66.

A cylindrical heater 70 is provided to cover the outer tube 14 around the outer tube 14. The heater 70 heats the wafers W accommodated in the processing container 10.

The space in the processing container 10 is divided into a plurality of unit regions, for example, five unit regions Za, Zb, Zc, Zd, and Ze along the vertical direction. The unit region Za is also referred to as "TOP" because it is the uppermost unit region in the vertical direction. Further, the unit region Ze is also referred to as "BTM" because it is the lowest unit region in the vertical direction. The unit regions Zb, Zc, and Zd are also referred to as "CTR1," "CTR2," and "CTR3," respectively, because they are intermediate regions in the vertical direction.

Further, the heater 70 is also divided into heaters 70a, 70b, 70c, 70d, and 70e so as to correspond one-to-one with the unit regions along the vertical direction. The outputs of the heaters 70a to 70e are independently controlled by power controllers 72a to 72e corresponding to each of the unit regions Za to Ze, respectively.

Further, in the space in the processing container 10, temperature sensors 80a to 80e configured to detect the temperature are provided corresponding to each of the unit regions Za to Ze. The temperature sensors 80a to 80e detect the temperature to detect the temperature distribution along the vertical direction. The temperature sensors 80a to 80e are accommodated in a protection tube 82 made of, for example, quartz, and are provided between the inner tube 12 and the outer tube 14. As illustrated in FIG. 2, the temperature sensors 80a to 80e and the protection tube 82 configured to accommodate the temperature sensors 80a to 80e are provided at a position shifted by a predetermined angle θ from the position of the opening 22 in the circumferential direction of the inner tube 12. Therefore, since the temperature sensors 80a to 80e are positioned at blind spots from the gas supply pipes 52, 54, and 56, it is possible to suppress the detected temperature of the temperature sensors 80a to 80e from being lowered by the gases ejected from the gas supply pipes 52, 54, and 56. For example, a thermocouple, or a resistance temperature detector may be used as the temperature sensors 80a to 80e.

Detection signals from the temperature sensors 80a to 80e are input to a controller 100 (to be described later) via a signal line 84. The controller 100 to which the detection signals are input calculates set values of the power controllers 72a to 72e, and outputs the calculated set values to each of the power controllers 72a to 72e. For example, by calculating the set values of the power controllers 72a to 72e by PID control, the controller 100 controls the output to each of the power controllers 72a to 72e, that is, the amount of heat generated by each of the heaters 70a to 70e.

The film forming apparatus 1 includes the controller 100 such as a computer configured to control the entire operation of the film forming apparatus 1. The controller 100 is connected to a storage unit 102 that stores control programs for realizing various processings executed by the film forming apparatus 1 by the controller 100, or various programs for causing respective components of the film forming apparatus 1 to execute processings according to processing conditions. The various programs may be stored in a storage medium and then stored in the storage unit 102. The storage medium may be a hard disk or a semiconductor memory, or may be a portable medium such as a CD-ROM, a DVD, or a flash memory. Further, the storage unit 102 may appropriately communicate with other devices or a host computer by a wired or wireless communication unit.

The controller 100 may be a controller provided separately from the film forming apparatus 1. Further, the storage unit 102 may be a storage device provided separately from the film forming apparatus 1.

(Film Forming Method)

A film forming method according to an embodiment will be described with reference to an example in which a thin film is formed by an atomic layer deposition (ALD) method using the film forming apparatus 1 described above. Examples of the thin film that may be formed by the film forming method according to the embodiment may include an oxide film such as $SiO_2$, $ZrO_2$, $HfO_2$, $TiO_2$, and $Al_2O_3$, a nitride film such as SiN, HfN, TiN, and AlN, or a composite film in which the above compounds are combined, such as ZrAlO, HfAlO, and HfSiON.

Figure 3:
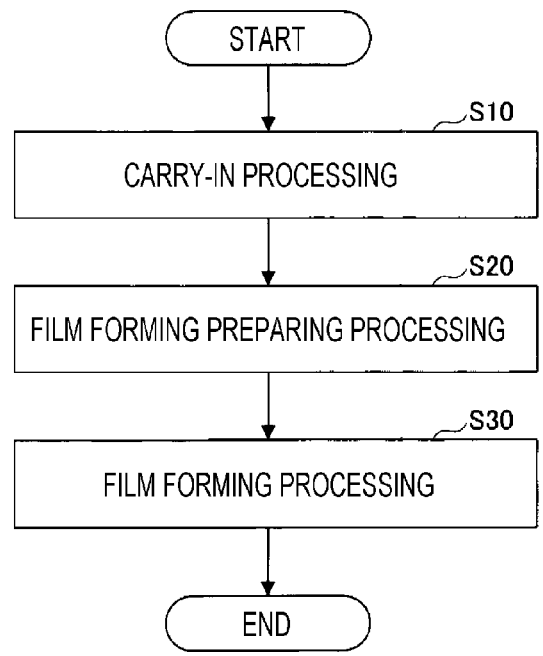
FIG. 3 is a flowchart illustrating an example of a film forming method according to an embodiment.

Hereinafter, descriptions will be made on a case where a silicon nitride (SiN) film is formed on the wafer W using a silicon-containing gas and a nitride gas as raw material gases. FIG. 3 is a flowchart illustrating an example of the film forming method according to an embodiment.

First, the wafer boat 16 holding a plurality of wafers W is carried into the processing container 10 by the lifting unit 38, and the opening at the lower end of the processing container 10 is air-tightly closed and sealed by the cover 30 (a carry-in processing S10). In the carry-in processing S10, the opening at the lower end of the processing container 10 is opened, so that the temperature in the processing container 10 is lowered. Therefore, the controller 100 controls the outputs of the heaters 70a to 70e based on the detected temperature of the temperature sensors 80a to 80e such that the lowered temperature in the processing container 10 is maintained at the set temperature (e.g., 300° C. to 700° C.) determined in advance by, for example, a recipe.

Subsequently, in a film forming processing S30 (to be described later), an inert gas is continuously supplied at the same flow rate as the average flow rate of all the gases supplied into the processing container 10, and the pressure in the processing container 10 is maintained at the same pressure as the average pressure in the processing container 10 in the film forming processing S30 (a film forming preparing processing S20). The average flow rate may be calculated, for example, after performing a processing under the same conditions as the film forming processing S30 at least once in advance before the film forming preparing processing S20, based on the measured flow rate of each gas measured by the flow rate controllers 52c, 54c, and 56c in the above processing. However, the average flow rate may be calculated based on the set flow rate of each gas when performing the film forming processing S30. The average pressure may be calculated, for example, after performing a processing under the same conditions as the film forming processing S30 at least once in advance before the film forming preparing processing S20, based on the pressure in the processing container 10 detected by the pressure sensor 69 in the above processing. Further, in the film forming preparing processing S20, the temperature is stabilized by heating the wafer W in the processing container 10 by the heater 70. Further, the film forming preparing processing S20 is performed, for example, while rotating the wafer boat 16. Further, in the film forming preparing processing S20, the controller 100 controls the outputs of the heaters 70a to 70e based on the detected temperature of the temperature sensors 80a to 80e such that the lowered temperature in the processing container 10 is maintained at the set temperature (e.g., 300° C. to 700° C.) determined in advance by, for example, a recipe. The set temperature may be the same as the set temperature in the film forming processing S30 from the viewpoint that the temperature fluctuation is reduced at the time of transition from the film forming preparing processing S20 to the film forming processing S30 (to be described later).

Subsequently, by the ALD method, a silicon nitride film is formed on the wafers W accommodated in the processing container 10 (the film forming processing S30). In the embodiment, the silicon-containing gas from the gas supply pipe 52, the inert gas from the gas supply pipe 56, the nitride gas from the gas supply pipe 54, and the inert gas from the gas supply pipe 56 are intermittently supplied in this order. Therefore, the silicon-containing gas is adsorbed on the wafers W in the first step of supplying the silicon-containing gas (an adsorption step), and the excess silicon-containing gas is purged in the next step of supplying the inert gas (a first purge step). Then, the nitride gas supplied in the next step of supplying the nitride gas is reacted with the silicon-containing gas (a nitriding step), and the excess nitride gas is purged by the next step of supplying the inert gas (a second purge step), and then, a thin unit film which is almost a mono-molecular layer is formed. A silicon nitride film having a desired film thickness is formed by performing the series of cycles a predetermined number of times. In the film forming processing S30, the controller 100 controls the outputs of the heaters 70a to 70e based on the detected values of the temperature sensors 80a to 80e such that the temperature in the processing container 10 is maintained at the set temperature (e.g., 300° C. to 700° C.) determined in advance by, for example, a recipe.

An example of the processing conditions of the film forming processing S30 is as follows.

Adsorption step: Silicon-containing gas (1 slm to 30 slm), Time (10 to 120 seconds)

First purge step: Inert gas (10 slm to 50 slm), Time (10 to 60 seconds)

Nitriding step: Nitride gas (15 slm to 25 slm), Time (60 to 180 seconds)

Second purge step: Inert gas (10 slm to 50 slm), Time (10 to 60 seconds)

However, the film forming processing S30 may include an evacuation step that evacuates the inside of the processing container 10 to a complete vacuum state of the vacuum pump 68 by the exhaust unit 62, between the adsorption step and the first purge step. Further, the film forming processing S30 may include an evacuation step that evacuates the inside of the processing container 10 to a complete vacuum state of the vacuum pump 68 by the exhaust unit 62, between the nitriding step and the second purge step.

In the film forming method according to the embodiment described above, a large flow rate of gas is supplied into the processing container 10 in a short time in the film forming processing S30 that forms a thin film by the ALD method.

At this time, a case is considered where the average flow rate of all the gases supplied into the processing container 10 in the film forming preparing processing S20 and the average flow rate of all the gases supplied into the processing container 10 in the film forming processing S30 are different from each other. In this case, the detected temperature of the temperature sensors 80a to 80e is changed by changes in the flow rate and flow velocity of the gas at the time of transition from the film forming preparing processing S20 to the film forming processing S30. As a result, the temperature fluctuation is likely to occur in the initial step of the film forming processing S30.

Further, a case is considered where the average pressure in the processing container 10 in the film forming preparing processing S20 and the average pressure in the processing container 10 in the film forming processing S30 are different from each other. In this case, the detected temperature of the temperature sensors 80a to 80e is changed by changes in the pressure at the time of transition from the film forming preparing processing S20 to the film forming processing S30. As a result, the temperature fluctuation is likely to occur in the initial step of the film forming processing S30.

Therefore, in the embodiment, in a film forming preparing processing S20, an inert gas is supplied at the same flow rate as the average flow rate of all the gases supplied into the processing container 10 in the film forming processing S30, and the pressure in the processing container 10 is maintained at the same pressure as the average pressure in the processing container 10 in the film forming processing S30. Therefore, since the changes in the flow rate or in the flow velocity of the gas or the change in the pressure in the processing container 10 at the time of transition from the film forming preparing processing S20 to the film forming processing S30 is reduced, it is possible to reduce the temperature fluctuation in the initial step of the film forming processing S30.

In the above embodiment, the ALD method has been described as an example of the film forming method. However, the present disclosure is not limited thereto, and may be similarly applied to, for example, a chemical vapor deposition (CVD) method.

Example

Descriptions will be made on an example in which the film forming method according to the embodiment is implemented to evaluate the stability of the detected temperature of the temperature sensors.

In Example 1, the carry-in processing S10, the film forming preparing processing S20, and the film forming processing S30 described above are implemented using the film forming apparatus 1 described above. Then, in each of the processings, a temporal change in detected temperature of the temperature sensors 80a, 80c, and 80e is evaluated. In Example 1, $N_2$ gas is used instead of the silicon-containing gas used in the adsorption step and the nitride gas used in the nitriding step. The processing conditions in the film forming preparing processing S20 and the film forming processing S30 in Example 1 are as follows.

[Processing Conditions]
Film Forming Preparing Processing S20
Flow rate of $N_2$ gas: 16 slm (continuously supplied)
Pressure in the processing container: 0.75 Torr (100 Pa)
Film Forming Processing S30
Average flow rate of $N_2$ gas: 16 slm (intermittently supplied)
Average pressure in the processing container: 0.75 Torr (100 Pa)

Further, following Comparative Example 1 is implemented for comparison with Example 1. Comparative Example 1 has the same processing conditions as the Example 1, except that the flow rate of $N_2$ gas is changed to 2 slm in the film forming preparing processing S20, and the pressure in the processing container 10 is changed to 0.25 Torr (33 Pa). Then, in each of the processings, a temporal change in detected temperature of the temperature sensors 80a, 80c, and 80e is evaluated. The processing conditions in the film forming preparing processing S20 and the film forming processing S30 in Comparative Example 1 are as follows.

[Processing Conditions]
Film Forming Preparing Processing S20
Flow rate of $N_2$ gas: 2 slm (continuously supplied)
Pressure in the processing container: 0.25 Torr (33 Pa)
Film Forming Processing S30
Average flow rate of $N_2$ gas: 16 slm (intermittently supplied)
Average pressure in the processing container: 0.75 Torr (100 Pa)

Figure 4A:
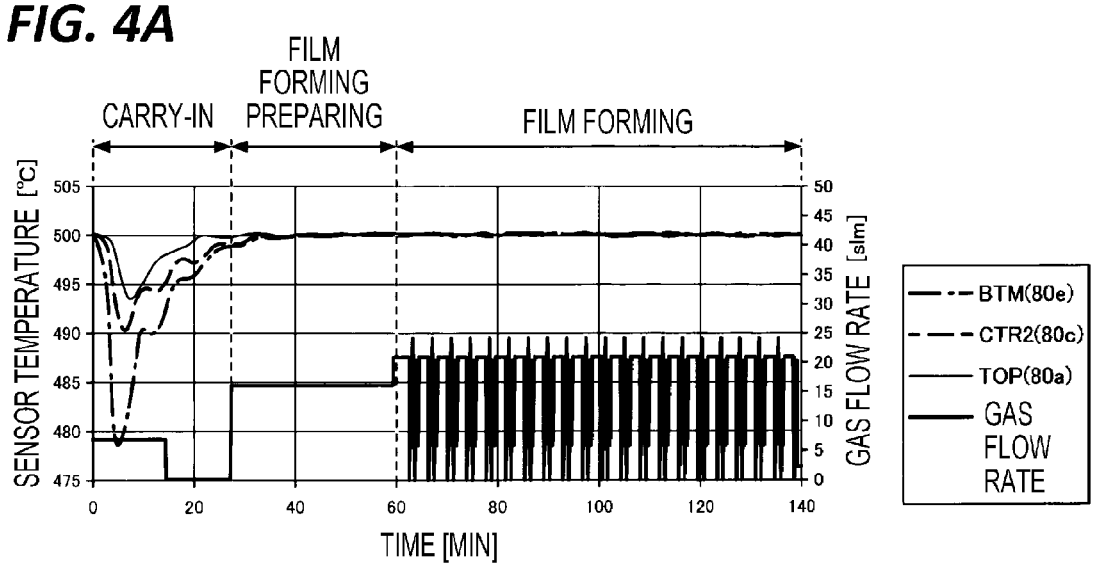
FIGS. 4A to 4C are views illustrating temporal change in temperature in each processing of Example 1.
Figure 4B:
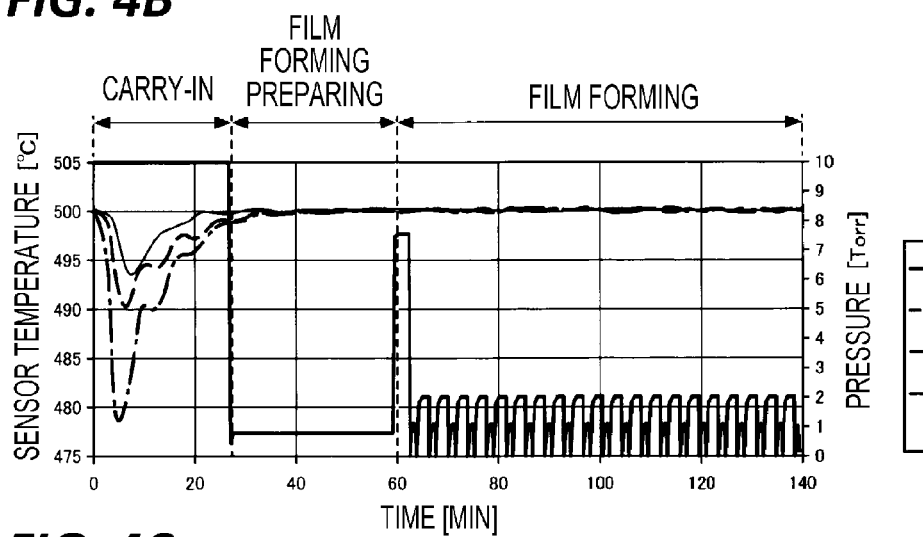
Figure 4C:
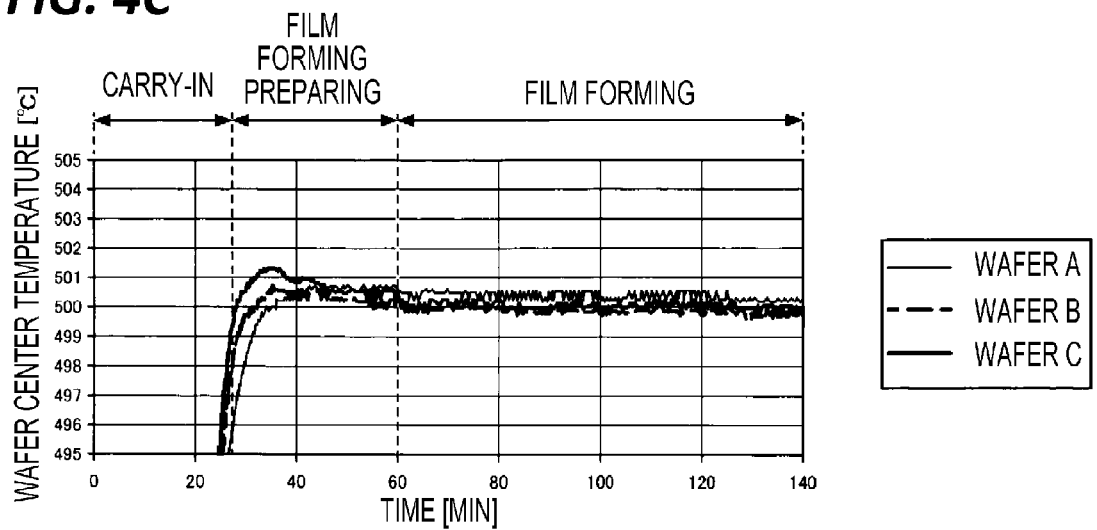

FIGS. 4A to 4C are views illustrating a temporal change in temperature in each processing of Example 1. FIG. 4A illustrates a temporal change in the flow rate of the gas supplied into the processing container 10 (bold solid line), and temporal changes in the detected temperatures of the temperature sensors 80a, 80c, and 80e (thin solid line, broken line, and dashed line, respectively). FIG. 4B illustrates a temporal change in the pressure in the processing container 10 (bold solid line) and temporal changes in the detected temperatures of the temperature sensors 80a, 80c, and 80e (thin solid line, broken line, and dashed line, respectively). FIG. 4C illustrates a temporal change in the wafer center temperature. In FIG. 4A, the horizontal axis represents time [min], the first vertical axis represents sensor temperature [° C.], and the second vertical axis represents gas flow rate [slm]. In FIG. 4B, the horizontal axis represents time [min], the first vertical axis represents sensor temperature [° C.], and the second vertical axis represents pressure [Torr]. In FIG. 4C, the horizontal axis represents time [min], and the vertical axis represents wafer center temperature [° C.]. Further, in FIG. 4C, the wafer A, the wafer B, and the wafer C are wafers positioned in the wafer boat 16 at different height positions.

Figure 5A:
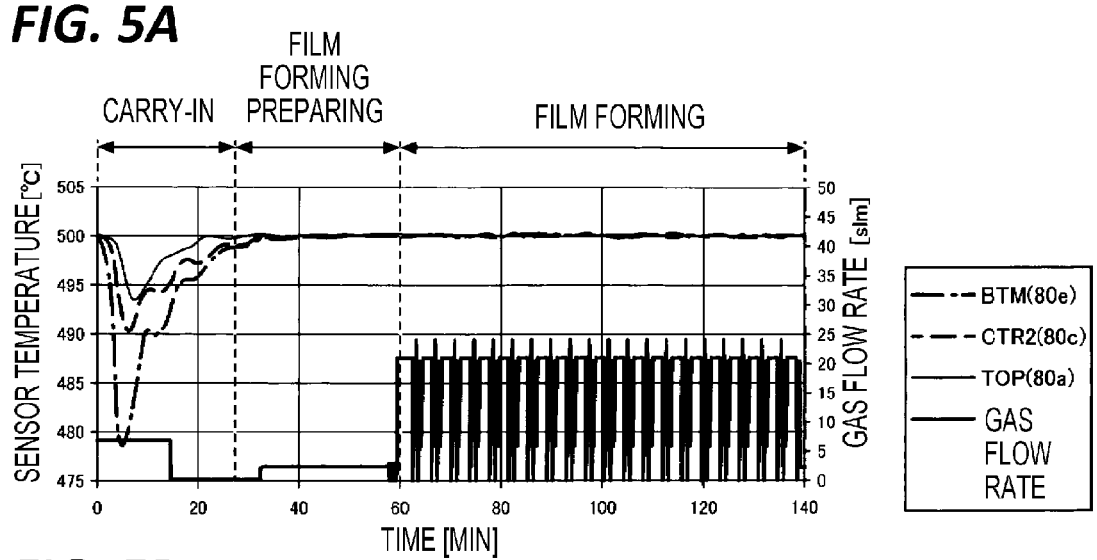
FIGS. 5A to 5C are views illustrating a temporal change in temperature in each processing of Comparative Example 1.
Figure 5B:
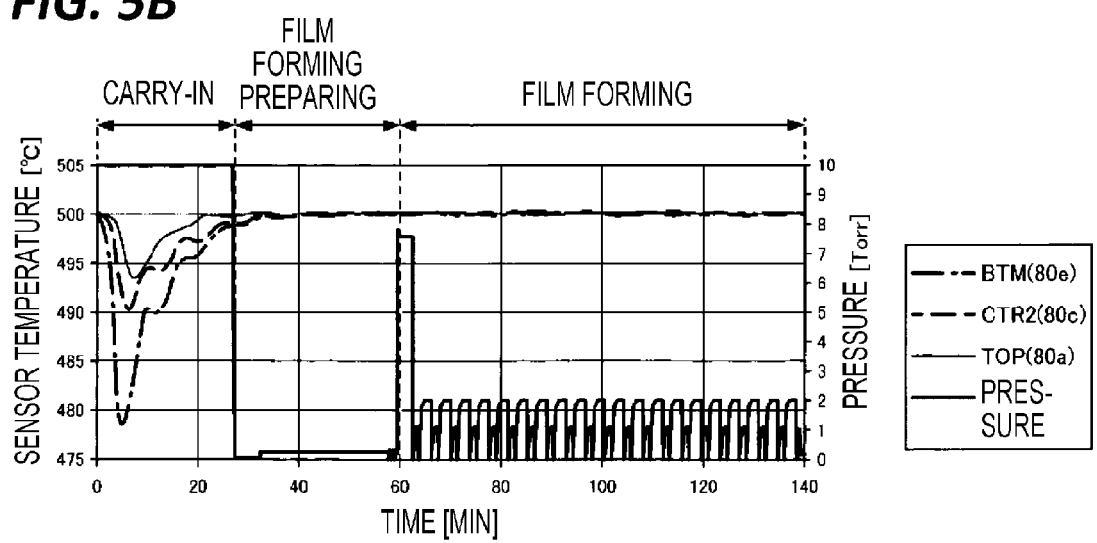
Figure 5C:
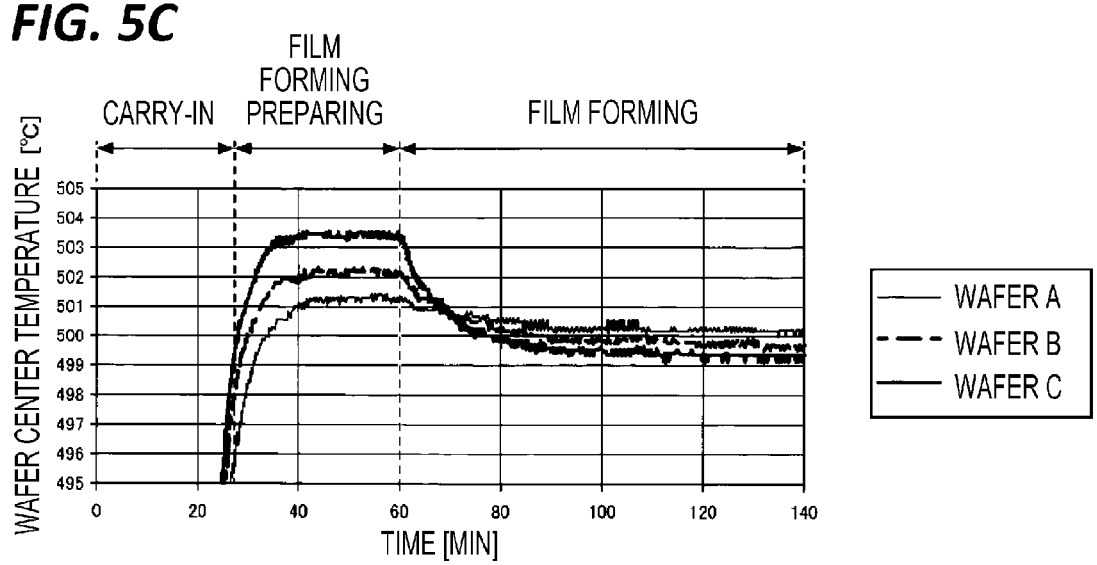

FIGS. 5A to 5C are views illustrating a temporal change in temperature in each processing of Comparative Example 1. FIG. 5A illustrates a temporal change in the flow rate of the gas supplied into the processing container 10 (bold solid line) and temporal changes in the detected temperature of the temperature sensors 80a, 80c, and 80e (thin solid line, broken line, and dashed line, respectively). FIG. 5B illustrates a temporal change in the pressure in the processing container 10 (bold solid line) and temporal changes in the detected temperatures of the temperature sensors 80a, 80c, and 80e (thin solid line, broken line, and dashed line, respectively). FIG. 5C illustrates a temporal change over time in the wafer center temperature. In FIG. 5A, the horizontal axis represents time [min], the first vertical axis represents sensor temperature [° C.], and the second vertical axis represents gas flow rate [slm]. In FIG. 5B, the horizontal axis represents time [min], the first vertical axis represents sensor temperature [° C.], and the second vertical axis represents pressure [Torr]. In FIG. 5C, the horizontal axis represents time [min], and the vertical axis represents wafer center temperature [° C.]. Further, in FIG. 5C, the wafer A, the wafer B, and the wafer C are wafers positioned in the wafer boat 16 at different height positions.

As illustrated in FIG. 4C, in Example 1, it may be seen that the temperature fluctuation at the center of the wafer due to the transition from the film forming preparing processing S20 to the film forming processing S30 hardly occurs, and the temperature at the center of the wafer is stabilized from the initial step of the film forming processing S30. Meanwhile, as illustrated in FIG. 5C, in Comparative Example 1, it may be seen that the temperature at the center of the wafer is lowered after the transition from the film forming preparing processing S20 to the film forming processing S30, and the temperature at the center of the wafer is stabilized after 20 to 30 minutes from the transition to the film forming processing S30. From the results, it is found that, in Example 1, the temperature fluctuation in the initial step of the film forming processing S30 may be reduced as compared with Comparative Example 1.

According to the present disclosure, the temperature fluctuation in the initial step of the film forming may be reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A film forming method comprising:
a carry-in processing of accommodating a substrate in a processing container of a film forming apparatus;
subsequent to the carry-in processing, a film forming preparing processing of supplying only an inert gas to the processing container at a flow rate equal to an average flow rate of a plurality of gases to be supplied into the processing container in a film forming processing and maintaining a pressure of the processing container to be substantially same as an average pressure of the processing container in the film forming processing; and
subsequent to the film forming preparing processing, the film forming processing of alternately supplying the plurality of gases into the processing container and forming a film on the substrate by an Atomic Layer Deposition (ALD), and
providing a controller that is configured to control steps of the film forming method,
wherein the controller is configured to control the flow rate of the inert gas equal to the average flow rate of the plurality of gases to be supplied into the processing container in the film forming processing and maintaining the pressure of the processing container to be substantially same as the average pressure of the processing container in the film forming processing, such that a wafer center temperature is stabilized during film forming preparing processing, and wherein the wafer center temperature is maintained within a range of 1° C. upon the transition to the film forming processing and during the film forming processing.

2. The film forming method according to claim 1, wherein the average flow rate is calculated in advance based on flow rates of the plurality of gases measured when the plurality of gases are supplied into the processing container under same conditions as the film forming processing.

3. The film forming method according to claim 1, wherein the average flow rate is calculated based on set flow rates of the plurality of gases in the film forming processing.

4. The film forming method according to claim 3, wherein the average pressure is calculated in advance based on pressures inside the processing container detected when plurality of gases are supplied into the processing container under same conditions as the film forming processing.

5. The film forming method according to claim 4, wherein the inert gas is continuously supplied in the film forming preparing processing.

6. The film forming method according to claim 5, wherein a plurality of substrates is accommodated in the processing container.

7. The film forming method according to claim 6, wherein the processing container extends vertically, and includes a gas supply pipe that extends along a longitudinal direction of the processing container and is configured to supply the plurality of gases into the processing container.

8. The film forming method according to claim 7, wherein a plurality of gas holes is formed along the longitudinal direction in the gas supply pipe.

9. The film forming method according to claim 1, wherein the average pressure is calculated in advance based on pressures inside the processing container detected when a plurality of gases are supplied into the processing container under same conditions as the film forming processing.

10. The film forming method according to claim 1, wherein the inert gas is continuously supplied in the film forming preparing processing.

11. The film forming method according to claim 1, wherein a plurality of substrates is accommodated in the processing container.

12. The film forming method according to claim 1, wherein the processing container extends vertically, and includes a gas supply pipe that extends along a longitudinal direction of the processing container and is configured to supply a plurality of gases into the processing container.

13. The film forming method according to claim 12, wherein a plurality of gas holes is formed along the longitudinal direction in the gas supply pipe.

14. A film forming apparatus comprising:
a processing container that extends in a vertical direction and accommodates a substrate;
a gas supply that supplies a plurality of gases into the processing container;
an exhaust port configured to exhaust an inside of the processing container; and
a controller that controls an overall operation of the film forming apparatus,
wherein the controller controls the gas supply and the exhaust port to perform a film forming process including:
a carry-in processing of accommodating the substrate in the processing container of the film forming apparatus;
subsequent to the carry-in processing, a film forming preparing processing of supplying only an inert gas to the processing container at a flow rate equal to an average flow rate of a plurality of gases to be supplied into the processing container in a film forming processing and maintaining a pressure of the processing container to be substantially same as an average pressure of the processing container in the film forming processing; and
subsequent to the film forming preparing processing, the film forming processing of alternately supplying the plurality of gases into the processing container and forming a film on the substrate by an Atomic Layer Deposition (ALD), and
wherein the controller controls the overall operation, including controlling the flow rate of the inert gas equal to the average flow rate of the plurality of gases to be supplied into the processing container in the film forming processing and maintaining the pressure of the processing container to be substantially same as the average pressure of the processing container in the film forming processing, such that a wafer center temperature is stabilized during film forming preparing processing, and such that the wafer center temperature is maintained within a range of 1° C. upon the transition to the film forming processing and during the film forming processing.

* * * * *